(12) United States Patent
Yan et al.

(10) Patent No.: US 11,482,578 B2
(45) Date of Patent: Oct. 25, 2022

(54) DISPLAY SUBSTRATE, DISPLAY APPARATUS, AND METHOD OF FABRICATING DISPLAY SUBSTRATE

(71) Applicant: BOE Technology Group Co., Ltd., Beijing (CN)

(72) Inventors: Huajie Yan, Beijing (CN); Tun Liu, Beijing (CN); Qingyu Huang, Beijing (CN); Xiaohu Li, Beijing (CN); Zhiqiang Jiao, Beijing (CN)

(73) Assignee: Beijing BOE Technology Development Co., Ltd., Beijing (CN)

( * ) Notice: Subject to any disclaimer, the term of this patent is extended or adjusted under 35 U.S.C. 154(b) by 164 days.

(21) Appl. No.: 16/639,120

(22) PCT Filed: Mar. 27, 2019

(86) PCT No.: PCT/CN2019/079894
§ 371 (c)(1),
(2) Date: Feb. 13, 2020

(87) PCT Pub. No.: WO2020/191670
PCT Pub. Date: Oct. 1, 2020

(65) Prior Publication Data
US 2021/0135122 A1    May 6, 2021

(51) Int. Cl.
*H01L 27/32* (2006.01)
*H01L 51/50* (2006.01)
(Continued)

(52) U.S. Cl.
CPC ...... *H01L 27/3246* (2013.01); *H01L 51/5056* (2013.01); *H01L 51/5072* (2013.01);
(Continued)

(58) Field of Classification Search
CPC ............. H01L 27/3246; H01L 51/5056; H01L 51/5072; H01L 51/56; H01L 2227/323
See application file for complete search history.

(56) References Cited

U.S. PATENT DOCUMENTS

| 9,679,952 B2 | 6/2017 | Miyazawa |
| 2012/0049210 A1 | 3/2012 | Takagi |

(Continued)

FOREIGN PATENT DOCUMENTS

| CN | 102386206 A | 3/2012 |
| CN | 103187434 A | 7/2013 |

(Continued)

OTHER PUBLICATIONS

Second Office Action in the Chinese Patent Application No. 201980000401.8, dated Jun. 8, 2020; English translation attached.
(Continued)

*Primary Examiner* — Aaron J Gray
(74) *Attorney, Agent, or Firm* — Intellectual Valley Law, P.C.

(57) ABSTRACT

A display substrate having a plurality of subpixels is provided. The display substrate includes a base substrate; and a pixel definition layer defining a plurality of subpixel apertures. The pixel definition layer includes a smart material sub-layer comprising a smart insulating material. The display substrate in a respective one of the plurality of subpixels includes an organic light emitting layer in a respective one of the plurality of subpixel apertures.

17 Claims, 9 Drawing Sheets

(51) Int. Cl.
*H01L 51/56* (2006.01)
*H01L 51/00* (2006.01)

(52) U.S. Cl.
CPC .......... *H01L 51/56* (2013.01); *H01L 27/3218* (2013.01); *H01L 51/0072* (2013.01); *H01L 2227/323* (2013.01)

(56) References Cited

U.S. PATENT DOCUMENTS

| | | | |
|---|---|---|---|
| 2012/0217516 A1* | 8/2012 | Hatano | H01L 51/525 257/E33.062 |
| 2015/0303393 A1 | 10/2015 | Dai et al. | |
| 2016/0043161 A1 | 2/2016 | Miyazawa | |
| 2019/0181195 A1 | 6/2019 | Wang et al. | |
| 2019/0213978 A1 | 7/2019 | Jia et al. | |
| 2020/0194732 A1* | 6/2020 | Yao | H01L 51/56 |
| 2021/0202624 A1* | 7/2021 | Gong | H01L 51/5092 |

FOREIGN PATENT DOCUMENTS

| | | | | |
|---|---|---|---|---|
| CN | 106910432 A | | 6/2017 | |
| CN | 107240599 A | | 10/2017 | |
| CN | 108091580 A | | 5/2018 | |
| CN | 109300961 A | | 2/2019 | |
| CN | 109524576 A | * | 3/2019 | ......... H01L 27/3246 |
| CN | 109524576 A | | 3/2019 | |
| WO | WO-2018227981 A | * | 12/2018 | ............. H01L 21/77 |

OTHER PUBLICATIONS

Yuwei Gu, et al., "Photoswitchinging topology in polymer networks with metal-organic cages as crosslinks", Nature, vol. 560, pp. 65-69 (2018).
International Search Report & Written Opinion dated Jan. 2, 2020, regarding PCT/CN2019/079894.
First Office Action in the Chinese Patent Application No. 201980000401.8, dated Jan. 19, 2020; English translation attached.

\* cited by examiner

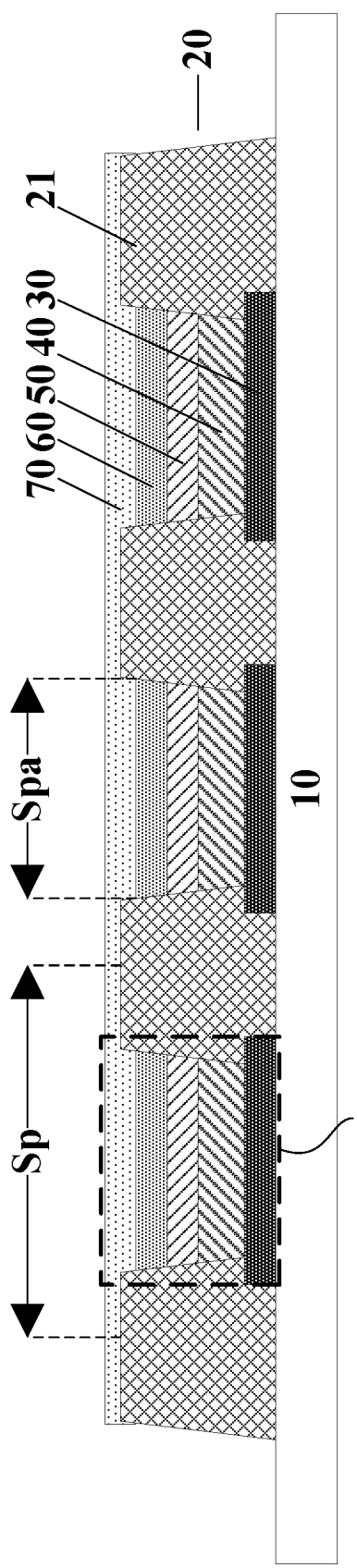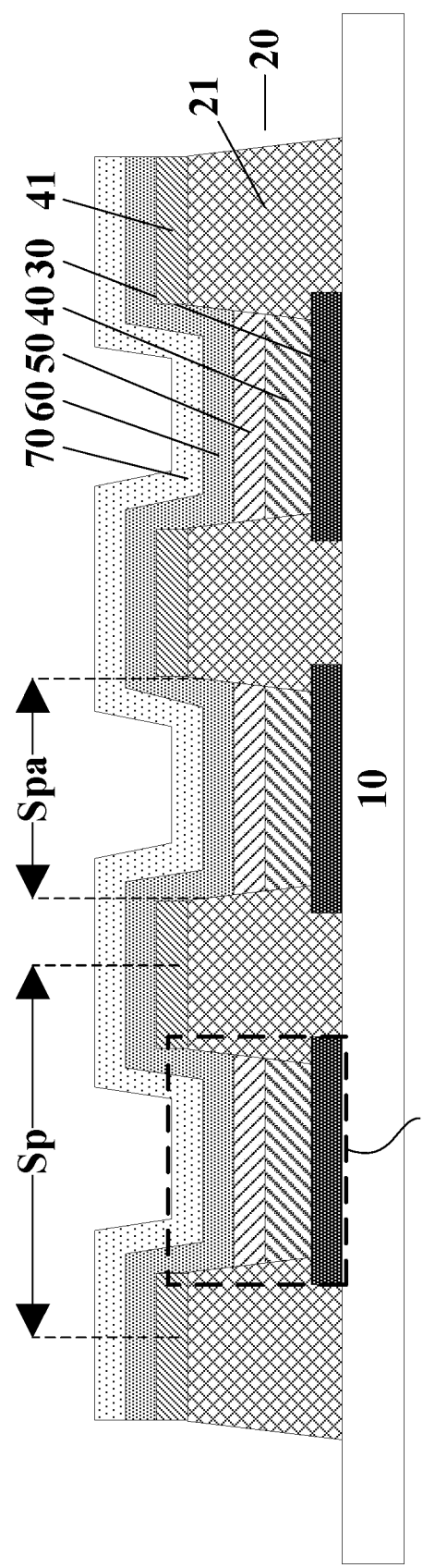
FIG. 1
FIG. 2

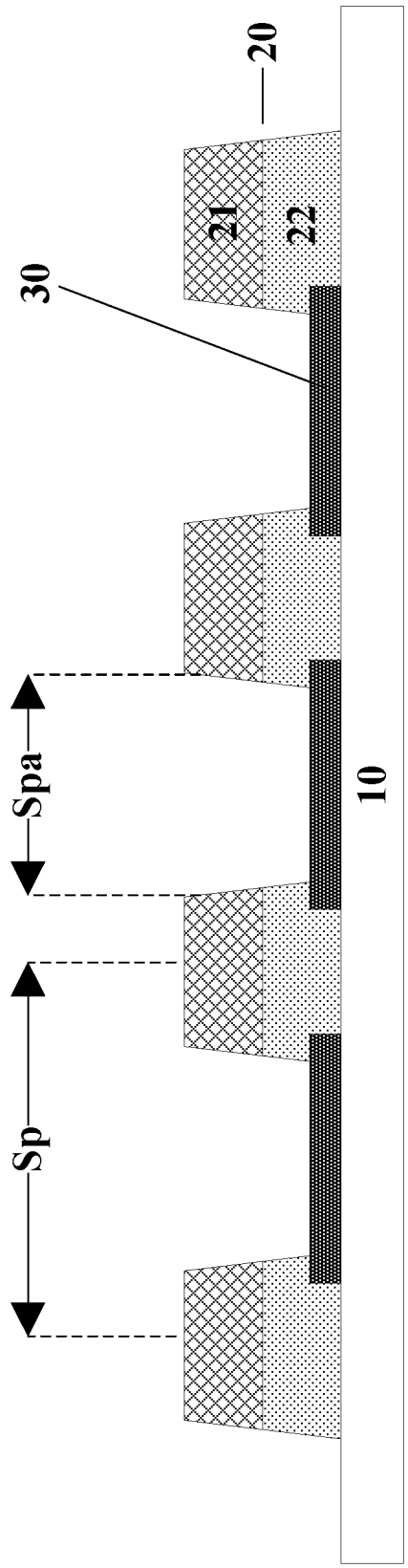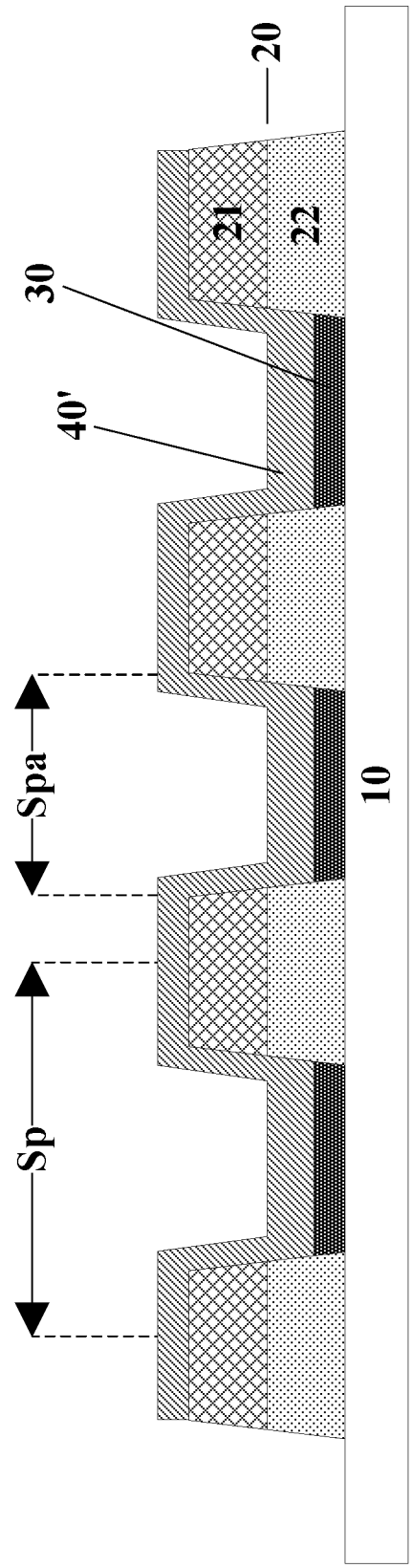

DISPLAY SUBSTRATE, DISPLAY APPARATUS, AND METHOD OF FABRICATING DISPLAY SUBSTRATE

CROSS-REFERENCE TO RELATED APPLICATION

This application is a national stage application under 35 U.S.C. § 371 of International Application No. PCT/CN2019/079894, filed Mar. 27, 2019, the contents of which are incorporated by reference in the entirety.

TECHNICAL FIELD

The present invention relates to display technology, more particularly, to a display substrate, a display apparatus, and a method of fabricating a display substrate.

BACKGROUND

Organic light emitting diode (OLED) display apparatuses are self-emissive devices. OLED display apparatuses also provide more vivid colors and a larger color gamut as compared to the conventional liquid crystal display (LCD) apparatuses, and do not require backlights. Further. OLED display apparatuses can be made more flexible, thinner, and lighter than a typical LCD apparatus.

SUMMARY

In one aspect, the present invention provides a display substrate having a plurality, of subpixels, comprising a base substrate; and a pixel definition layer defining a plurality of subpixel apertures; wherein the pixel definition layer comprises a smart material sub-layer comprising a smart insulating material; and the display substrate in a respective one of the plurality of subpixels comprises an organic light emitting layer in a respective one of the plurality of subpixel apertures.

Optionally, the display substrate in the respective one of the plurality of subpixels further comprises a first electrode on a side of the organic light emitting layer closer to the base substrate; and an organic functional layer on a side of the first electrode away from the base substrate and between the first electrode and the organic light emitting layer; wherein the organic functional layer in the respective one of the plurality of subpixel apertures is spaced apart and disconnected from counterparts in adjacent subpixel apertures of the plurality of subpixel apertures.

Optionally, the first electrode is an anode; and the organic functional layer comprises one or a combination of a hole injection layer and a hole transport layer.

Optionally, the first electrode is a cathode; and the organic functional layer comprises one or a combination of an electron injection layer and an electron transport layer.

Optionally, the display substrate further comprises a residual organic layer on a side of the smart material sub-layer away from the base substrate; wherein the residual organic layer is spaced apart and disconnected from the organic functional layer in the respective one of the plurality of subpixel apertures; an orthographic projection of the residual organic layer on the base substrate at least partially overlaps with an orthographic projection of the smart material sub-layer on the base substrate; and the residual organic layer and the organic functional layer are in a same layer and comprise a same material.

Optionally, the smart material sub-layer has a first side closer to the base substrate, a second side opposite to the first side and away from the base substrate, and a lateral side connecting the first side and the second side; and at least a portion of the lateral side is absent of the residual organic layer and the organic functional layer, thereby disconnecting the residual organic layer from the organic functional layer, and disconnecting the organic functional layer in the respective one of the plurality of subpixel apertures from the counterparts in adjacent subpixel apertures of the plurality of subpixel apertures.

Optionally, the pixel definition layer further comprises a second sub-layer on a side of the smart material sub-layer closer to the base substrate, the second sub-layer and the smart material sub-layer being made of different materials.

Optionally, the display substrate further comprises a second residual organic layer on a lateral side of the smart material sub-layer; wherein the second residual organic layer is spaced apart and disconnected from the organic functional layer in the respective one of the plurality of subpixel apertures.

Optionally, the smart material sub-layer is made of a photoresponsive material.

Optionally, the photoresponsive material comprises a photostrictive material comprising an organic polymer material selected from a group consisting of photostrictive polymer network comprising metal-organic cages as cross-links, photostrictive liquid crystal polymer network, photostrictive polyamides having azobenzene chromophores in the main chain, poly-(4,4'-diaminoazobenzenepyromellitimide), and poly(ethylacrylate) network with azo-aromatic crosslinks.

In another aspect, the present invention provides a display apparatus, comprising the display substrate described herein or fabricated by a method described herein, and one or more integrated circuits connected to the display substrate.

In another aspect, the present invention provides a method of fabricating a display substrate having a plurality of subpixels, comprising forming a pixel definition layer on a base substrate to define a plurality of subpixel apertures; and forming an organic light emitting layer in a respective one of the plurality of subpixel apertures in a respective one of the plurality of subpixels; wherein forming the pixel definition layer comprises forming a smart material sub-layer using a material comprising a smart insulating material.

Optionally, the method further comprises, prior to forming the organic light emitting layer, forming a first electrode on the base substrate in the respective one of the plurality of subpixels; and prior to forming the organic light emitting layer and subsequent to forming the first electrode, forming an organic functional layer on a side of the first electrode away from the base substrate; wherein the organic functional layer in the respective one of the plurality of subpixel apertures is formed to be spaced apart and disconnected from counterparts in adjacent subpixel apertures of the plurality of subpixel apertures.

Optionally, forming the organic functional layer comprises depositing an organic functional material layer on a side of the first electrode away from the base substrate, the organic functional material layer deposited to at least partially cover the smart material sub-layer; and applying a non-mechanical external stimulus on the smart material sub-layer to induce the smart material sub-layer to undergoes a deformation to segregate the organic functional material layer into a plurality of blocks, a respective one of the plurality of blocks in the respective one of the plurality of subpixel apertures, the respective one of the plurality of blocks being spaced apart and disconnected from counterparts in adjacent subpixel apertures of the plurality of subpixel apertures, thereby forming the organic functional layer.

Optionally, the deformation segregates the organic functional material layer into the plurality of blocks respectively in the plurality of subpixel apertures, and a residual organic layer on a side of the smart material sub-layer away from the base substrate; the residual organic layer is spaced apart and disconnected from the organic functional layer in the respective one of the plurality of subpixel apertures; and an orthographic projection of the residual organic layer on the base substrate at least partially overlaps with an orthographic projection of the smart material sub-layer on the base substrate.

Optionally, the smart material sub-layer is formed to have a first side closer to the base substrate, a second side opposite to the first side and away from the base substrate, and a lateral side connecting the first side and the second side; and the deformation results in at least a portion of the lateral side being absent of the residual organic layer and the organic functional layer, thereby disconnecting the residual organic layer from the organic functional layer, and disconnecting the organic functional layer in the respective one of the plurality of subpixel apertures from the counterparts in adjacent subpixel apertures of the plurality of subpixel apertures.

Optionally, forming the pixel definition layer further comprising, prior to forming the smart material sub-layer, forming a second sub-layer using a material different from a material of the smart material sub-layer.

Optionally, the first electrode is formed as an anode; and forming the organic functional layer comprises, prior to forming the organic light emitting layer, forming one or a combination of a hole injection layer and a hole transport layer.

Optionally, the first electrode is formed as a cathode; and forming the organic functional layer comprises, prior to forming the organic light emitting layer, forming one or a combination of an electron injection layer and an electron transport layer.

Optionally, the smart material sub-layer is made of a photoresponsive material.

Optionally, the smart material sub-layer is made of a photoresponsive material; and applying a non-mechanical external stimulus on the smart material sub-layer comprises irradiating light on the smart material sub-layer.

BRIEF DESCRIPTION OF THE FIGURES

The following drawings are merely examples for illustrative purposes according to various disclosed embodiments and are not intended to limit the scope of the present invention.

FIG. 1 is a schematic diagram illustrating the structure of a display substrate in some embodiments according to the present disclosure.

FIG. 2 is a schematic diagram illustrating the structure of a display substrate in some embodiments according to the present disclosure.

FIGS. 5A to 5E illustrate a method of fabricating a display substrate in some embodiments according to the present disclosure.

DETAILED DESCRIPTION

Figure 3:
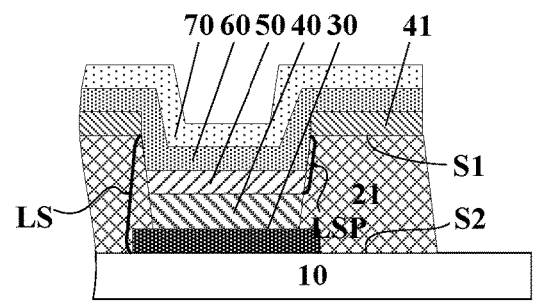
FIG. 3 is a partial zoom-in view of the display substrate of FIG. 2.

The disclosure will now be described more specifically with reference to the following embodiments. It is to be noted that the following descriptions of some embodiments are presented herein for purpose of illustration and description only. It is not intended to be exhaustive or to be limited to the precise form disclosed.

The present disclosure provides, inter alia, a display substrate, a display apparatus, and a method of fabricating a display substrate that substantially obviate one or more of the problems due to limitations and disadvantages of the related art. In one aspect, the present disclosure provides a display substrate having a plurality of subpixels. In some embodiments, the display substrate includes a base substrate; and a pixel definition layer defining a plurality of subpixel apertures. The pixel definition layer includes a smart material sub-layer comprising a smart insulating material. The display substrate in a respective one of the plurality of subpixels includes an organic light emitting layer in a respective one of the plurality of subpixel apertures.

As used herein, the term "smart material" in the context of the present disclosure refer to a material capable of undergoing a change in mechanical behavior (e.g., volume, diameter, height) when one or more external non-mechanical stimuli are applied to the material. In the context of the present disclosure, the term "smart insulating material" refers to an insulating material capable of undergoing a change in volume when one or more external stimuli are applied to the material. In some embodiments, the smart material or the smart insulating material is a material or an insulating material that can be caused to expand or contract through an application of irradiation (e.g., light), heat, electric voltage, magnetic fields, or any combination thereof. In some embodiments, the smart material or the smart insulating material is a material in a solid state that exhibits a coupled mechanical-nonmechanical behavior that can be used to generate a straining of the smart material or the smart insulating material by means other than mechanical loading. Optionally, the smart material or the smart insulating material undergoes a change in volume of at least 4% (e.g., at least 6%, at least 8%, at least 10%, at least 12%, at least 14%, at least 16%, at least 18%, at least 20%, at least 22%, at least 24%, at least 26%, at least 28%, or at least 30%) as compared to an initial volume upon the application of irradiation, heat, electric voltage, magnetic fields, or any combination thereof. Optionally, the smart material or the smart insulating material undergoes a change in a lateral dimension of at least 4% (e.g., at least 6%, at least 8%, at least 10%, at least 12%, at least 14%, at least 16%, at least 18%, at least 20%, at least 22%, at least 24%, at least 26%, at least 28%, or at least 30%) as compared to an initial lateral dimension upon the application of irradiation, heat, electric voltage, magnetic fields, or any combination thereof.

Examples of smart materials include piezoelectric composites, electro-active polymers, shape memory alloys, and carbon nanotube composites.

Optionally, the smart material is a photoresponsive material. As used herein, the term "photoresponsive material" refers to a material capable of undergoing a change in mechanical behavior (e.g., volume, diameter, height) upon an application of irradiation (e.g., light). Optionally, the photoresponsive material is a photostrictive material. As used herein, the term "photostrictive material" refers to a material capable of contracting upon an application of irradiation (e.g., light). Optionally, the photoresponsive material is a photoexpansive material. As used herein, the term "photoexpansive material" refers to a material capable of expanding upon an application of irradiation (e.g., light). Examples of photoresponsive materials include an organic polymer material selected from a group consisting of photostrictive polymer network comprising metal-organic cages as crosslinks (Nature 560, 65-69, 2018), photostrictive liquid crystal polymer network (Materials 2013, 6(1), 116-142; J Mater. Chem. C, 2, 3047 2014), photostrictive polyamides having azobenzene chromophores in the main chain (Bull. Chem. Soc Jan 81(8), 917, 2008), poly-(4,4'-diaminoazobenzenepyromellitimide) (Nature 230, 70, 1971), and poly(ethylacrylate) network with azo-aromatic crosslinks (Polymer 21(10), 1175 1980).

Optionally, the smart material is a thermoresponsive material. As used herein, the term "thermoresponsive material" refers to a material capable of undergoing a change in mechanical behavior (e.g., volume, diameter, height) upon an application of a change in temperature (e.g., heat). Optionally, the thermoresponsive material is a thermostrictive material. As used herein, the term "thermostrictive material" refers to a material capable of contracting upon an application of a change in temperature (e.g., heat). Optionally, the thermoresponsive material is a thermoexpansive material. As used herein, the term "thermoexpansive material" refers to a material capable of expanding upon an application of a change in temperature (e.g., heat).

Optionally, the smart material is an electroactive material. As used herein, the term "electroactive material" refers to a material capable of undergoing a change in mechanical behavior (e.g., volume, diameter, height) upon an application of a change in electric voltage. Optionally, the electroactive material is an electrostrictive material. As used herein, the term "electrostrictive material" refers to a material capable of contracting upon an application of a change in electric voltage. Optionally, the electroactive material is an electroexpansive material. As used herein, the term "electroexpansive material" refers to a material capable of expanding upon an application of a change in electric voltage.

Optionally, the smart material is a magnetoactive material. As used herein, the term "magnetoactive material" refers to a material capable of undergoing a change in mechanical behavior (e.g., volume, diameter, height) upon an application of a change in magnetic field. Optionally, the magnetoactive material is a magnetostrictive material. As used herein, the term "magnetostrictive material" refers to a material capable of contracting upon an application of a change in magnetic field. Optionally, the magnetoactive material is a magnetoexpansive material. As used herein, the term "magnetoexpansive material" refers to a material capable of expanding upon an application of a change in magnetic field.

FIG. 1 is a schematic diagram illustrating the structure of a display substrate in some embodiments according to the present disclosure. Referring to FIG. 1, the display substrate in some embodiments has a plurality of subpixels Sp. The display substrate includes a base substrate 10; and a pixel definition layer 20 defining a plurality of subpixel apertures Spa. The pixel definition layer 20 includes a smart material sub-layer 21 having a smart insulating material. The display substrate in a respective one of the plurality of subpixels Sp includes an organic light emitting layer 50 in a respective one of the plurality of subpixel apertures Spa.

In a respective one of the plurality of subpixels Sp, the display substrate includes an organic light emitting diode OLED. The organic light emitting diode OLED includes a first electrode 30 on the base substrate 10, an organic functional layer 40 on a side of the first electrode 30 away from the base substrate 10, an organic light emitting layer 50 on a side of the organic functional layer 40 away from the base substrate 10, and a second electrode 70 on a side of the organic light emitting layer 50 away from the base substrate 10. The organic functional layer 40 is between the first electrode 30 and the organic light emitting layer 50. Optionally, the organic light emitting diode OILED further includes a second organic functional layer 60 on a side of the organic light emitting layer 50 away from the base substrate 10, and between the organic light emitting layer 50 and the second electrode 70. Optionally, the second electrode 70 is formed as a continuous integral layer spanning across the plurality of subpixels Sp, e.g., throughout substantially all subpixels of the display substrate. In FIG. 1, the second organic functional layer 60 is shown as constituting a plurality of blocks respectively in the plurality of subpixel apertures Spa. Optionally, the second organic functional layer 60 is formed as a continuous integral layer spanning across the plurality of subpixels Sp, e.g., throughout substantially all subpixels of the display substrate. The second electrode 70 and the second organic functional layer 60 may be formed using an open mask deposition process to reduce fabrication costs, obviating the patterning process using a fine metal mask.

In some embodiments, the first electrode 30 is an anode, and the second electrode 70 is a cathode. Optionally, the organic functional layer 40 includes one or a combination of a hole injection layer and a hole transport layer. In one example, the organic functional layer 40 includes a hole injection layer and a hole transport layer. Optionally, the second organic functional layer 60 includes one or a combination of an electron injection layer and an electron transport layer. In one example, the second organic functional layer 60 includes an electron injection layer and an electron transport layer.

In some embodiments, the first electrode 30 is a cathode, and the second electrode 70 is an anode. Optionally, the organic functional layer 40 includes one or a combination of an electron injection layer and an electron transport layer. In one example, the organic functional layer 40 includes an electron injection layer and an electron transport layer. Optionally, the second organic functional layer 60 includes one or a combination of a hole injection layer and a hole transport layer. In one example, the second organic functional layer 60 includes a hole injection layer and a hole transport layer.

Referring to FIG. 1, in some embodiments, the organic functional layer 40 in the respective one of the plurality of subpixel apertures Spa is spaced apart and disconnected from counterparts in adjacent subpixel aperturess of the plurality of subpixel apertures Spa. In some embodiments, the organic functional layer 40 is formed using an open mask deposition process to deposit one or more organic functional material on the base substrate 10, e.g., as a continuous integral layer spanning across the plurality of subpixels Sp, e.g., throughout substantially all subpixels of the display substrate. Subsequently, a non-mechanical external stimulus (e.g., irradiation such as light, electrical voltage, temperature change such as heat, and magnetic field) is applied to the smart material sub-layer 21 to induce the smart material sub-layer 21 to undergoes a deformation to segregate the organic functional material layer into a plurality of blocks, a respective one of the plurality of blocks in the respective one of the plurality of subpixel apertures Spa. As a result, the respective one of the plurality of blocks are spaced apart and disconnected from counterparts in adjacent subpixel apertures of the plurality of subpixel apertures Spa, thereby forming the organic functional layer 40. Thus, although the organic functional layer 40 is formed in a process involving an open mask deposition process to save costs, due to the presence of the smart material sub-layer 21, the organic functional layer 40 is formed so that the organic functional layer 40 in the respective one of the plurality of subpixel apertures Spa is spaced apart and disconnected from counterparts in adjacent subpixel apertures of the plurality of subpixel apertures Spa. The fabrication process will be discussed in greater details below in connection with the discussion of the method of fabrication.

FIG. 2 is a schematic diagram illustrating the structure of a display substrate in some embodiments according to the present disclosure. Referring to FIG. 2, in some embodiments, the organic functional layer 40 is formed using an open mask deposition process. As a result, the display substrate further includes a residual organic layer 41 on a side of the smart material sub-layer 21 away from the base substrate 10. As discussed, in the open mask deposition process, one or more organic functional material is deposited on the base substrate 10, e.g., as a continuous integral layer spanning across the plurality of subpixels Sp, e.g., throughout substantially all subpixels of the display substrate. A non-mechanical external stimulus is applied to the smart material sub-layer 21 to induce the smart material sub-layer 21 to undergoes a deformation to segregate the organic functional material layer into a plurality of blocks, and a residual organic layer 41 spaced apart and disconnected from the organic functional layer 40 in the respective one of the plurality of subpixel apertures Spa. The fabrication process will be discussed in greater details below in connection with the discussion of the method of fabrication.

Optionally, an orthographic projection of the residual organic layer 41 on the base substrate 10 at least partially overlaps with an orthographic projection of the smart material sub-layer 21 on the base substrate 10. Optionally, the orthographic projection of the residual organic layer 41 on the base substrate 10 is substantially non-overlapping with an orthographic projection of the organic functional layer 40 on the base substrate 10. Optionally, the orthographic projection of the residual organic layer 41 on the base substrate 10 and the orthographic projection of the organic functional layer 40 on the base substrate 10 partially overlap with each other.

FIG. 3 is a partial zoom-in view of the display substrate of FIG. 2. Referring to FIG. 3, the smart material sub-layer 21 has a first side S2 closer to the base substrate 10, a second side S1 opposite to the first side S2 and away from the base substrate 10, and a lateral side LS connecting the first side S2 and the second side S1. Optionally, at least a portion LSP of the lateral side LS is absent of the residual organic layer 41 and the organic functional layer 40, thereby disconnecting the residual organic layer 41 from the organic functional layer 40, and disconnecting the organic functional layer 40 in the respective one of the plurality of subpixel apertures from the counterparts in adjacent subpixel apertures of the plurality of subpixel apertures. Optionally, the at least a portion LSP is covered by one or a combination of the organic light emitting layer 50 and the second organic functional layer 60. Optionally, as shown in FIG. 3, the at least a portion LSP is partially covered by the organic light emitting layer 50 and partially covered by the second organic functional layer 60.

As shown in FIG. 2 and FIG. 3, in some embodiments, the second electrode 70 and the second organic functional layer 60 are formed using an open mask deposition process to reduce fabrication costs, obviating the patterning process using a fine metal mask.

Optionally, the residual organic layer 41 and the organic functional layer 40 are in a same layer and comprise a same material. As used herein, the term "same layer" refers to the relationship between the layers simultaneously formed in the same step. In one example, the residual organic layer 41 and the organic functional layer 40 are in a same layer when they are formed as a result of one or more steps of a same process performed in a same layer of material. For example, the residual organic layer 41 and the organic functional layer 40 are formed as result of depositing one or more organic functional materials and applying a non-mechanical stimulus to the smart material sub-layer 21. In another example, the residual organic layer 41 and the organic functional layer 40 can be formed in a same layer by simultaneously performing the step of forming the residual organic layer 41 and the step of forming the organic functional layer 40. The term "same layer" does not always mean that the thickness of the layer or the height of the layer in a cross-sectional view is the same.

In some embodiments, the first electrode 30 is an anode, and the second electrode 70 is a cathode. Optionally, the organic functional layer 40 includes one or a combination of a hole injection layer and a hole transport layer. In one example, the organic functional layer 40 includes a hole injection layer and a hole transport layer. Optionally, the second organic functional layer 60 includes one or a combination of an electron injection layer and an electron transport layer. In one example, the second organic functional layer 60 includes an electron injection layer and an electron transport layer. Optionally, the residual organic layer 41 includes one or a combination of a hole injection material layer and a hole transport material layer. In one example, the residual organic layer 41 includes a hole injection material layer and a hole transport material layer.

In some embodiments, the first electrode 30 is a cathode, and the second electrode 70 is an anode. Optionally, the organic functional layer 40 includes one or a combination of an electron injection layer and an electron transport layer. In one example, the organic functional layer 40 includes an electron injection layer and an electron transport layer. Optionally, the second organic functional layer 60 includes one or a combination of a hole injection layer and a hole transport layer. In one example, the second organic functional layer 60 includes a hole injection layer and a hole transport layer. Optionally, the residual organic layer 41 includes one or a combination of an electron injection material layer and an electron transport material layer. In one example, the residual organic layer 41 includes an electron injection material layer and an electron transport material layer.

Figure 4A:
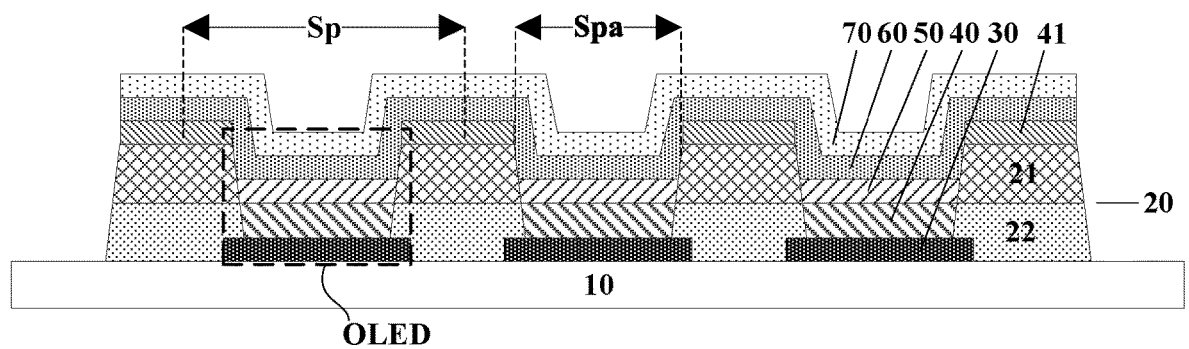
FIG. 4A is a schematic diagram illustrating the structure of a display substrate in some embodiments according to the present disclosure.

FIG. 4A is a schematic diagram illustrating the structure of a display substrate in some embodiments according to the present disclosure. Referring to FIG. 4A, in some embodiments, the pixel definition layer 20 further includes a second sub-layer 22. Optionally, the second sub-layer 22 is on a side of the smart material sub-layer 21 closer to the base substrate 10. Optionally, the second sub-layer 22 and the smart material sub-layer 21 are made of different materials. Optionally, the second sub-layer 22 is made of a non-smart insulating material, e.g., resin.

Figure 4B:
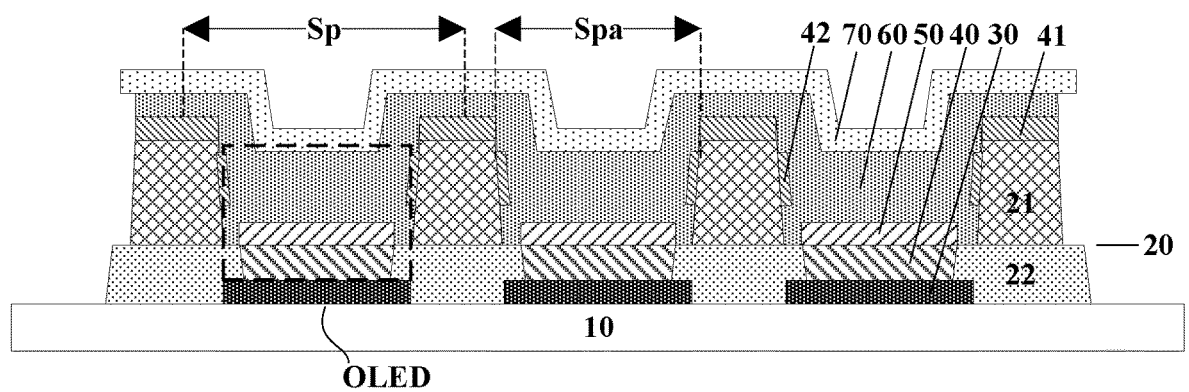
FIG. 4B is a schematic diagram illustrating the structure of a display substrate in some embodiments according to the present disclosure.

FIG. 4B is a schematic diagram illustrating the structure of a display substrate in some embodiments according to the present disclosure. Referring to FIG. 4B, in some embodiments, the display substrate further includes a second residual organic layer 42 on a lateral side of the smart material sub-layer 21. The second residual organic layer 42 is disconnected from the organic functional layer 40 in the respective one of the plurality of subpixel apertures Spa.

In another aspect, the present disclosure provides a display panel having a display substrate described herein or fabricated by a method described herein, and a counter substrate facing the display substrate. Optionally, the display panel is a liquid crystal display panel. Optionally, the display panel is an organic light emitting diode display panel.

In another aspect, the present disclosure provides a display apparatus having a display substrate described herein or fabricated by a method described herein, and one or more integrated circuits connected to the display substrate. Optionally, the display apparatus is a liquid crystal display apparatus. Optionally, the display apparatus is an organic light emitting diode display apparatus. Examples of appropriate display apparatuses include, but are not limited to, an electronic paper, a mobile phone, a tablet computer, a television, a monitor, a notebook computer, a digital album, a GPS, etc.

In another aspect, the present disclosure provides a method of fabricating a display substrate having a plurality of subpixels. In some embodiments, the method includes forming a pixel definition layer on a base substrate to define a plurality of subpixel apertures; and forming an organic light emitting layer in a respective one of the plurality of subpixel apertures in a respective one of the plurality of subpixels. Optionally, the step of forming the pixel definition layer includes forming a smart material sub-layer using a material comprising a smart insulating material.

Specifically, in some embodiments, the method includes forming an organic light emitting diode in a respective one of the plurality of subpixels. Optionally, the step of forming the organic light emitting diode includes forming a first electrode on the base substrate, forming an organic functional layer on a side of the first electrode away from the base substrate, forming an organic light emitting layer on a side of the organic functional layer away from the base substrate, and forming a second electrode on a side of the organic light emitting layer away from the base substrate. The organic functional layer is formed between the first electrode and the organic light emitting layer. Optionally, the step of forming organic light emitting diode further includes step of forming a second organic functional layer on a side of the organic light emitting layer away from the base substrate, and between the organic light emitting layer and the second electrode. Optionally, the second electrode is formed as a continuous integral layer spanning across the plurality of subpixels Sp, e.g., throughout substantially all subpixels of the display substrate. Optionally, the second organic functional layer is formed to constitute a plurality of blocks respectively in the plurality of subpixel apertures. Optionally, the second organic functional layer is formed as a continuous integral layer spanning across the plurality of subpixels, e.g., throughout substantially all subpixels of the display substrate. The second electrode and the second organic functional layer may be formed using an open mask deposition process to reduce fabrication costs, obviating the patterning process using a fine metal mask.

In some embodiments, the method further includes, prior to forming the organic light emitting layer, forming a first electrode on the base substrate in the respective one of the plurality of subpixels; and prior to forming the organic light emitting layer and subsequent to forming the first electrode, forming an organic functional layer on a side of the first electrode away from the base substrate. The organic functional layer in the respective one of the plurality of subpixel apertures is formed to be spaced apart and disconnected from counterparts in adjacent subpixel apertures of the plurality of subpixel apertures.

In some embodiments, the step of forming the organic functional layer includes depositing an organic functional material layer on a side of the first electrode away from the base substrate, the organic functional material layer deposited to at least partially cover the smart material sub-layer; and applying a non-mechanical external stimulus on the smart material sub-layer to induce the smart material sub-layer to undergoes a deformation to segregate the organic functional material layer into a plurality of blocks, a respective one of the plurality of blocks in the respective one of the plurality of subpixel apertures, the respective one of the plurality of blocks being spaced apart and disconnected from counterparts in adjacent subpixel apertures of the plurality of subpixel apertures, thereby forming the organic functional layer.

Examples of non-mechanical external stimuli include irradiation (e.g., light), temperature change (e.g., heat and cooling), electric voltage, magnetic fields, or any combination thereof. Optionally, the smart material or the smart insulating material undergoes a change in volume of at least 4% (e.g., at least 6%, at least 8%, at least 10%, at least 12%, at least 14%, at least 16%, at least 18%, at least 20%, at least 22%, at least 24%, at least 26%, at least 28%, or at least 30%) as compared to an initial volume upon the application of irradiation, heat, electric voltage, magnetic fields, or any combination thereof. Optionally, the smart material or the smart insulating material undergoes a change in a lateral dimension of at least 4% (e.g., at least 6%, at least 8%, at least 10%, at least 12%, at least 14%, at least 16%, at least 18%, at least 20%, at least 22%, at least 24%, at least 26%, at least 28%, or at least 30%) as compared to an initial lateral dimension upon the application of irradiation, heat, electric voltage, magnetic fields, or any combination thereof. Optionally, the smart material or the smart insulating material undergoes a change in volume of 25% to 50% as compared to an initial volume upon the application of irradiation, heat, electric voltage, magnetic fields, or any combination thereof. Optionally, the smart material or the smart insulating material undergoes a change in a lateral dimension of 25% to 50% as compared to an initial volume upon the application of irradiation, heat, electric voltage, magnetic fields, or any combination thereof.

In some embodiments, the deformation segregates the organic functional material layer into the plurality of blocks respectively in the plurality of subpixel apertures, and a residual organic layer on a side of the smart material sub-layer away from the base substrate. Optionally, the residual organic layer is spaced apart and disconnected from the organic functional layer in the respective one of the plurality of subpixel apertures. Optionally, an orthographic projection of the residual organic layer on the base substrate at least partially overlaps with an orthographic projection of the smart material sub-layer on the base substrate.

In some embodiments, the smart material sub-layer is formed to have a first side closer to the base substrate, a second side opposite to the first side and away from the base substrate, and a lateral side connecting the first side and the second side. Optionally, the deformation results in at least a portion of the lateral side being absent of the residual organic layer and the organic functional layer, thereby disconnecting the residual organic layer from the organic functional layer, and disconnecting the organic functional layer in the respective one of the plurality of subpixel apertures from the counterparts in adjacent subpixel apertures of the plurality of subpixel apertures.

In some embodiments, the step of forming the pixel definition layer further includes, prior to forming the smart material sub-layer, forming a second sub-layer using a material different from a material of the smart material sub-layer.

In some embodiments, the first electrode is formed as an anode, and the step of forming the organic functional layer includes, prior to forming the organic light emitting layer, forming one or a combination of a hole injection layer and a hole transport layer. Optionally, the step of forming the second organic functional layer includes, subsequent to forming the organic light emitting layer, forming one or a combination of an electron injection layer and an electron transport layer.

In some embodiments, the first electrode is formed as a cathode; and the step of forming the organic functional layer includes, prior to forming the organic light emitting layer, forming one or a combination of an electron injection layer and an electron transport layer. Optionally, the step of forming the second organic functional layer includes, subsequent to forming the organic light emitting layer, forming one or a combination of a hole injection layer and a hole transport layer.

Figure 5C:
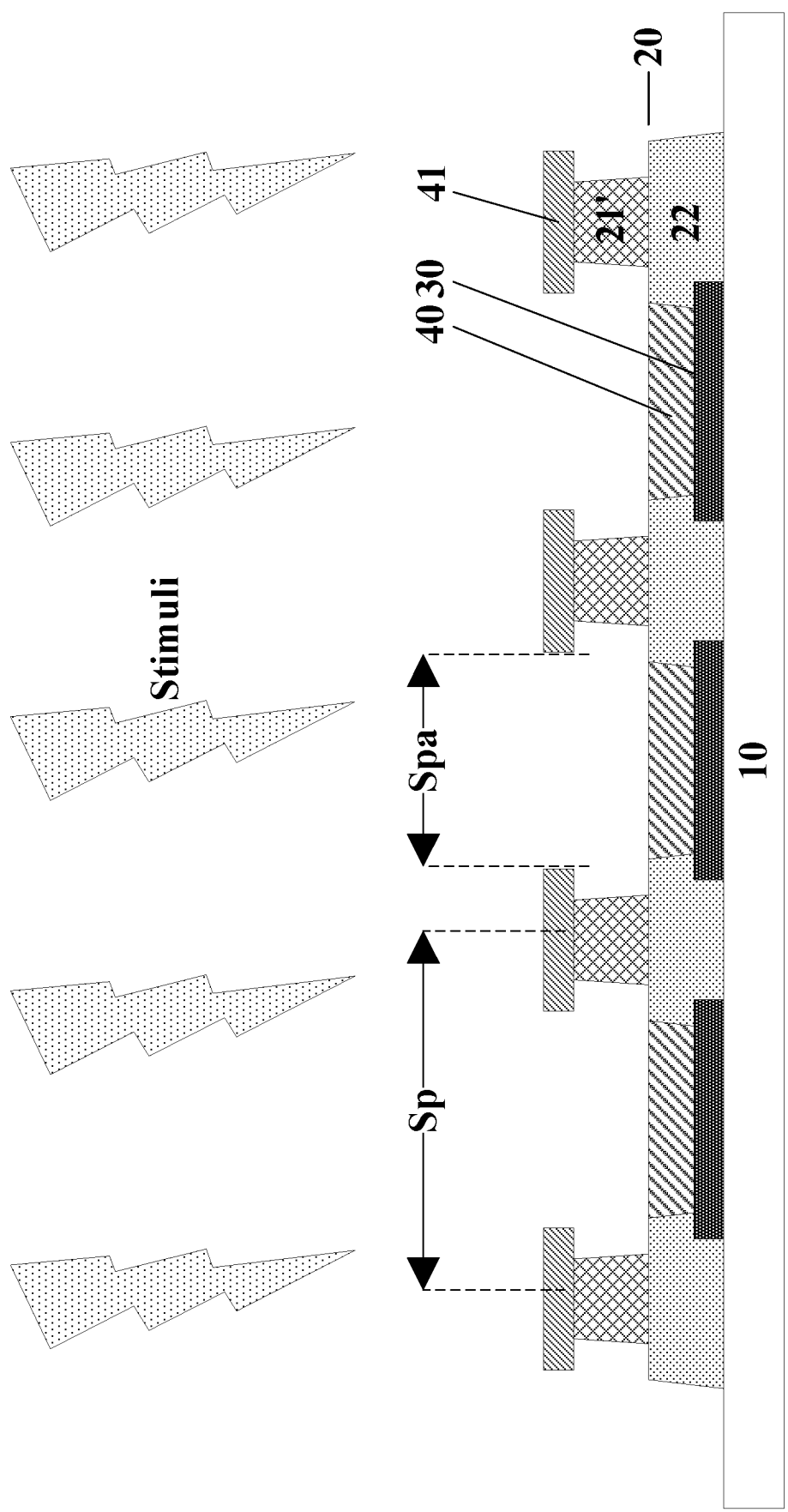

FIGS. 5A to 5E illustrate a method of fabricating a display substrate in some embodiments according to the present disclosure. Referring to FIG. 5A, a pixel definition layer 20 is first formed on the base substrate 10 to define a plurality of subpixel apertures Spa. The step of forming the pixel definition layer 20 includes forming a second sub-layer 22 on the base substrate 10 using a non-smart material such as a resin, followed by forming a smart material sub-layer 21 on a side of the second sub-layer 22 away from the base substrate 10 using a smart insulating material. In a respective one of the plurality of subpixels Sp, a first electrode 30 is formed on the base substrate, e.g., at the bottom of a respective one of the plurality of subpixel apertures Spa.

Referring to FIG. 5B, an organic functional material layer 40' is formed on a side of the first electrode 30 and the smart material sub-layer 21 away from the base substrate 10. Optionally, the organic functional material layer 40' includes one or a combination of a hole injection material layer and a hole transport material layer. Optionally, the organic functional material layer 40' includes one or a combination of an electron injection material layer and an electron transport material layer. The organic functional material layer 40' is formed as a continuous integral layer spanning across a plurality of subpixels Sp.

Referring to FIG. 5C, non-mechanical external stimuli (e.g., irradiation such as UV light) are applied to the smart material sub-layer 21. As a result, the smart material sub-layer 21 undergoes a contraction (in one example) to form a deformed smart material sub-layer 21'. Due to the contraction of the smart material sub-layer 21, the organic functional material layer 40' is segregated into a plurality of subpixel blocks and a plurality of residual blocks. The plurality of subpixel blocks are respectively in the plurality of subpixel apertures Spa, thereby forming the organic functional layer 40. The plurality of residual blocks are respectively on a side of the deformed smart material sub-layer 21' away from the base substrate 10, thereby forming the residual organic layer 41.

Figure 5D:
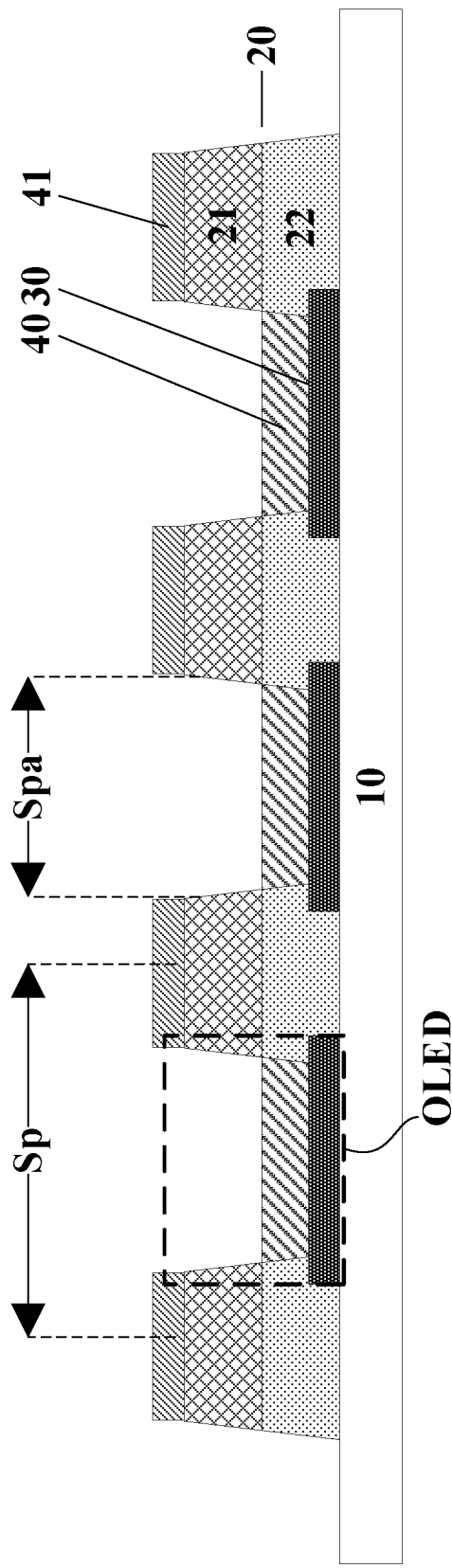

Referring to FIG. 5D, upon withdrawal of the non-mechanical external stimuli, the deformed smart material sub-layer 21' optionally is reversed back to the smart material sub-layer 21. However, the deformation in some embodiments may be irreversible.

Figure 5E:
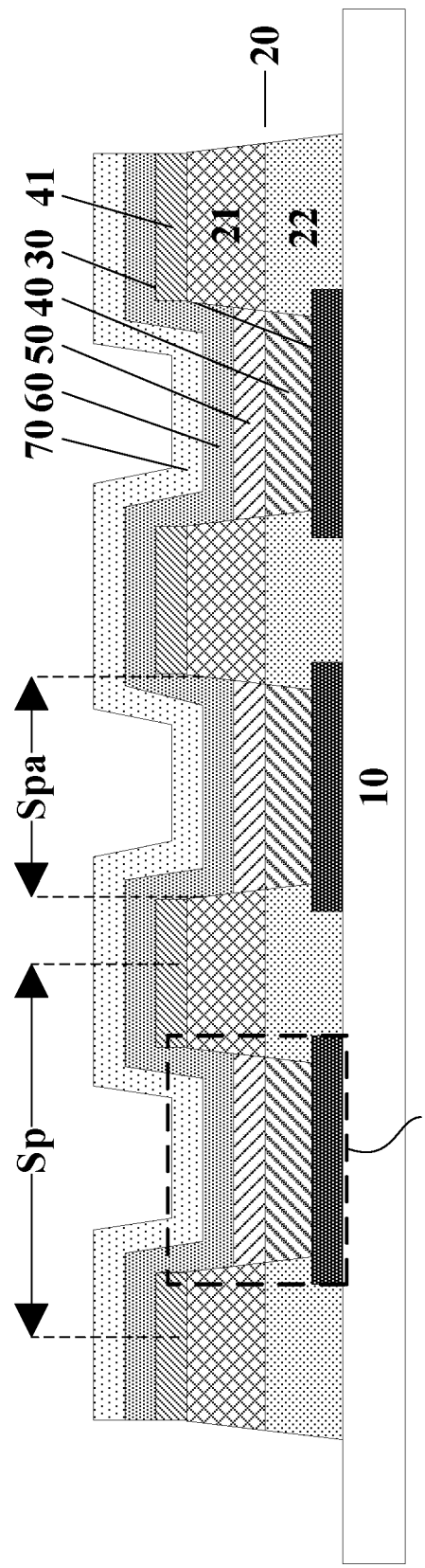

Referring to FIG. 5E, an organic light emitting layer 50 is formed on a side of the organic functional layer 40 away from the base substrate 10, a second organic functional layer 60 is formed on a side of the organic light emitting layer 50 away from the base substrate 10, and a second electrode 70 is formed on a side of the second organic functional layer 60 away from the base substrate 10. The second organic functional layer 60 and the second electrode 70 are respectively formed as continuous integral layers spanning across the plurality of subpixels Sp, e.g., throughout substantially all subpixels of the display substrate. The second electrode 70 and the second organic functional layer 60 may be formed using an open mask deposition process to reduce fabrication costs, obviating the patterning process using a fine metal mask.

Figure 6A:
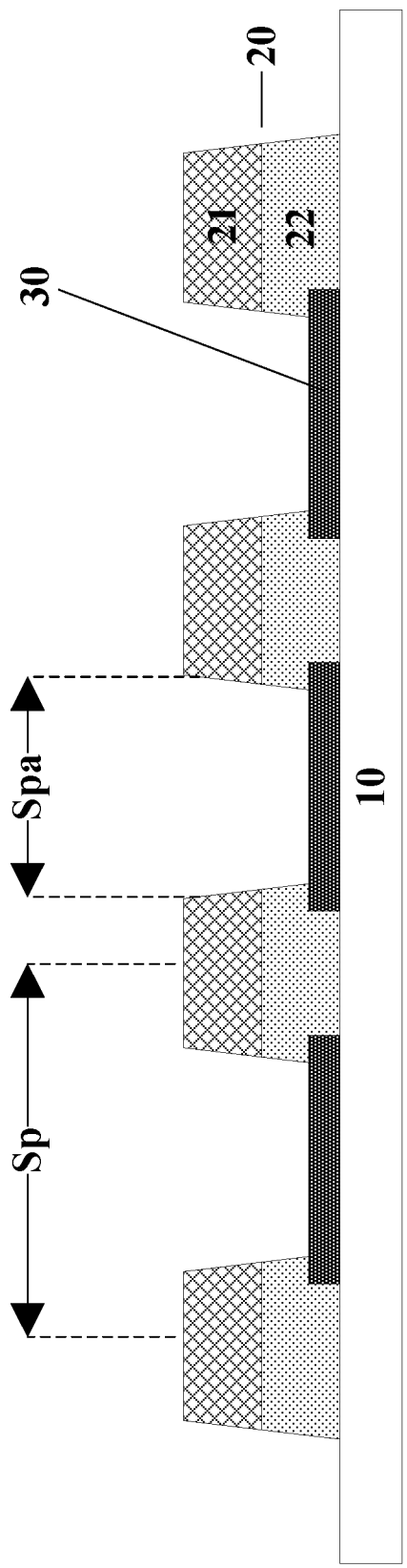
FIGS. 6A to 6E illustrate a method of fabricating a display substrate in some embodiments according to the present disclosure.
Figure 6B:
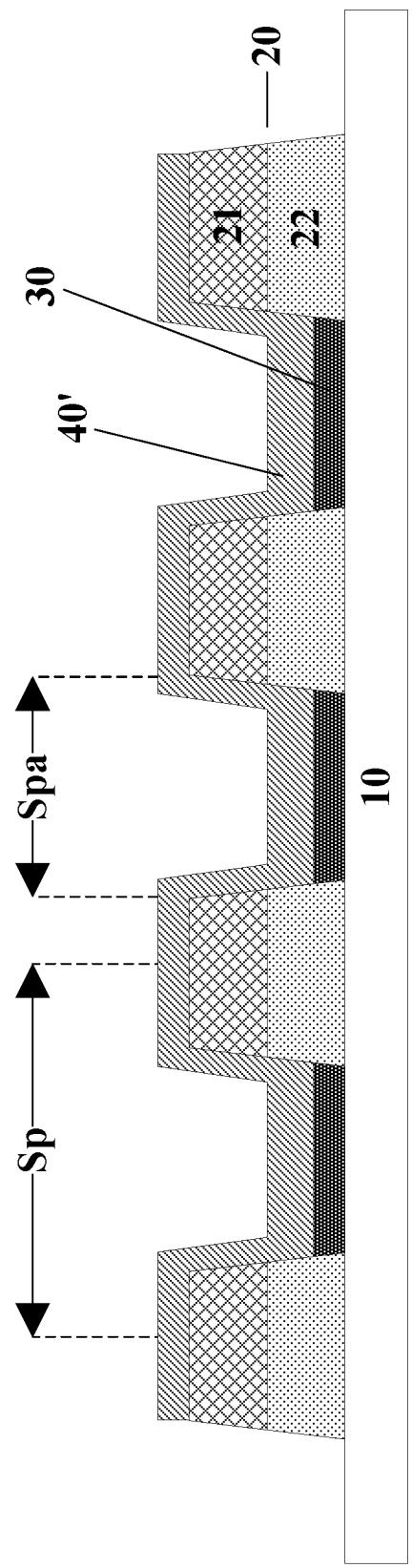
Figure 6C:
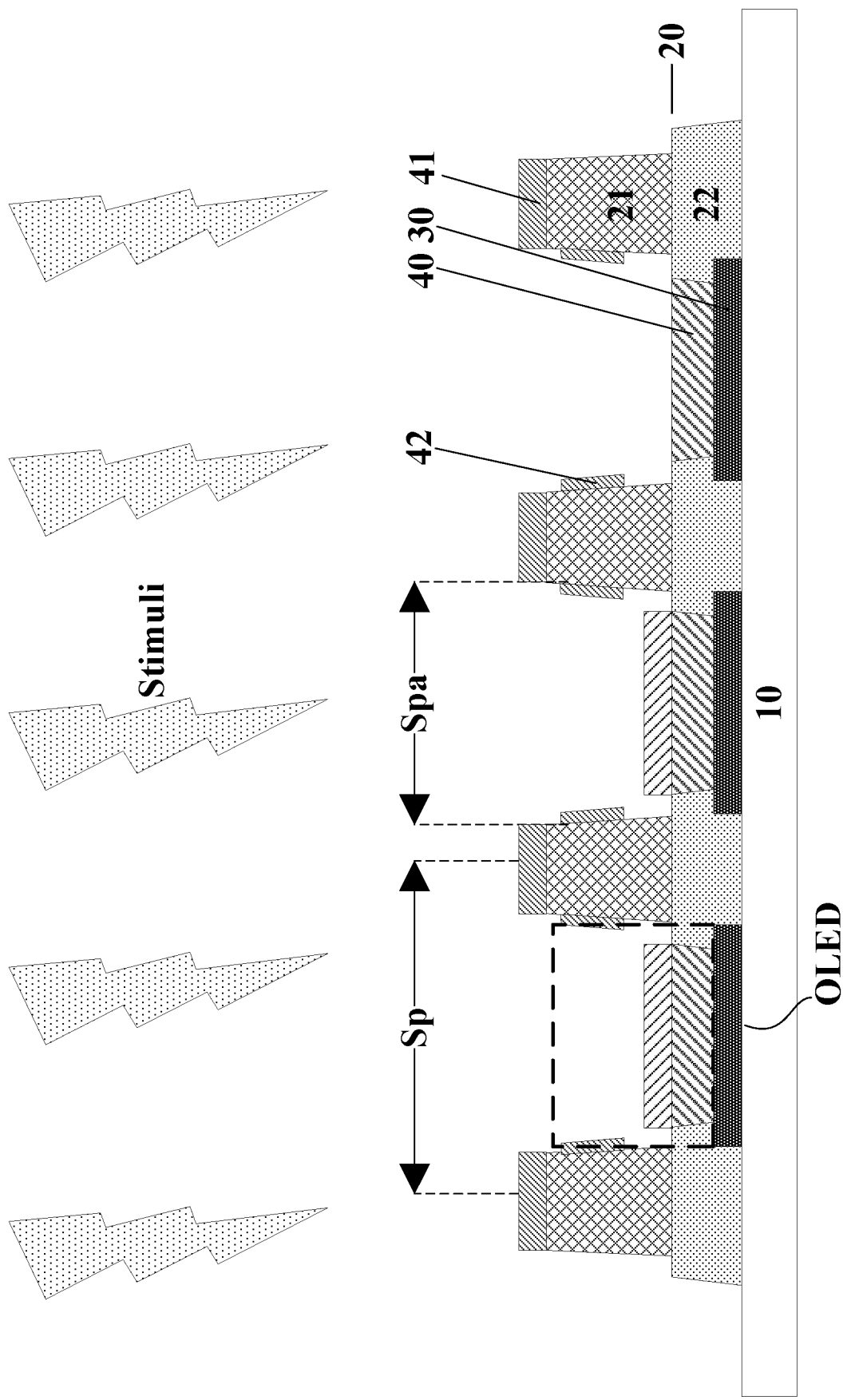
Figure 6D:
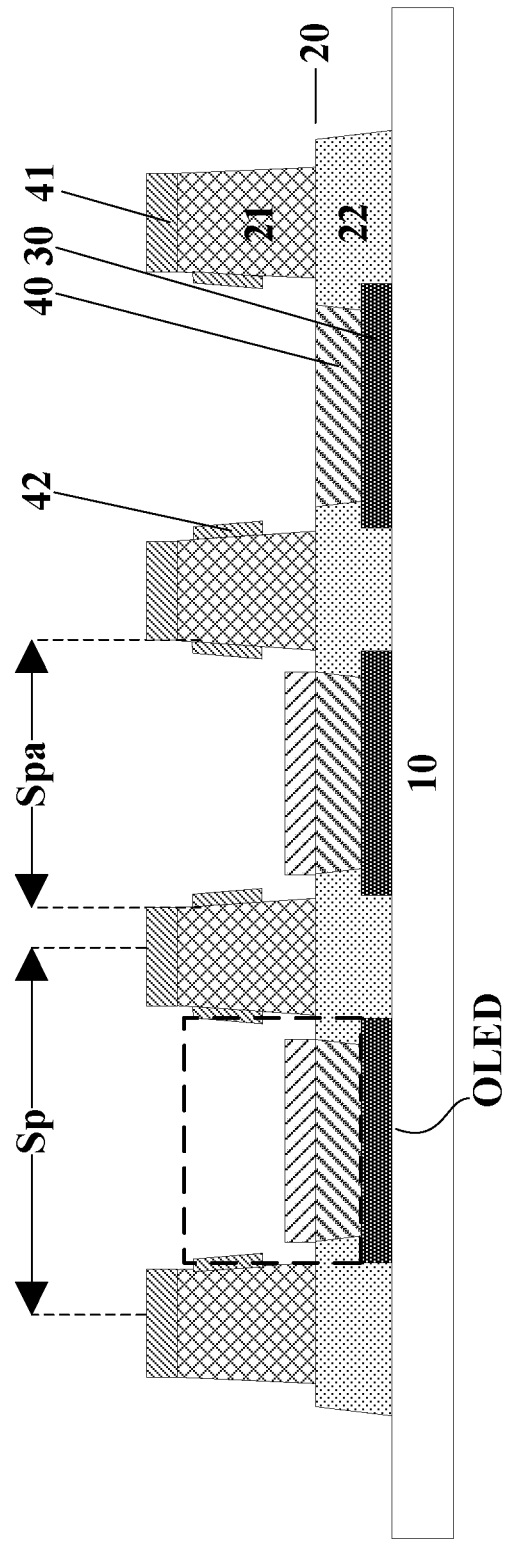
Figure 6E:
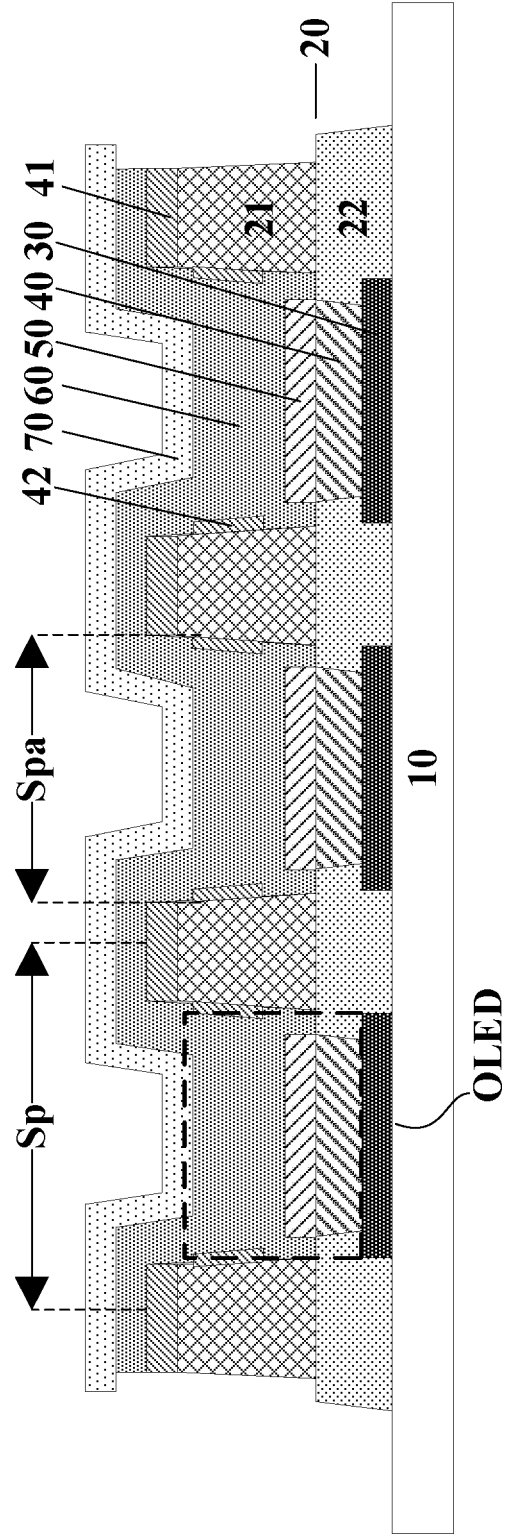

FIGS. 6A to 6E illustrate a method of fabricating a display substrate in some embodiments according to the present disclosure. The processes depicted in FIG. 6A to 6E are largely similar to those depicted in FIGS. 5A to 5E, with a few distinctions. Referring to FIG. 6D, upon withdrawal of the non-mechanical external stimuli, the deformed smart material sub-layer 21' is not reversed back to the smart material sub-layer 21, e.g., the deformation is largely irreversible. Also, referring to FIG. 6C and FIG. CD, non-mechanical external stimuli (e.g., irradiation such as UV light) are applied to the smart material sub-layer 21. As a result, the smart material sub-layer 21 undergoes a contraction (in one example) to form a deformed smart material sub-layer 21'. Due to the contraction of the smart material sub-layer 21, the organic functional material layer 40' is segregated into a plurality of subpixel blocks, a plurality of first residual blocks, and a plurality of second residual blocks. The plurality of subpixel blocks are respectively in the plurality of subpixel apertures Spa, thereby forming the organic functional layer 40. The plurality of first residual blocks are respectively on a side of the deformed smart material sub-layer 21' away from the base substrate 10, thereby forming the residual organic layer 41. The plurality of second residual blocks are respectively on lateral sides of the deformed smart material sub-layer 21', thereby forming a second residual organic layer 42 on a lateral side of the deformed smart material sub-layer 21'. The second residual organic layer 42 is disconnected from the organic functional layer 40 in the respective one of the plurality of subpixel apertures Spa, as shown in FIG. 6E.

Figure 7:
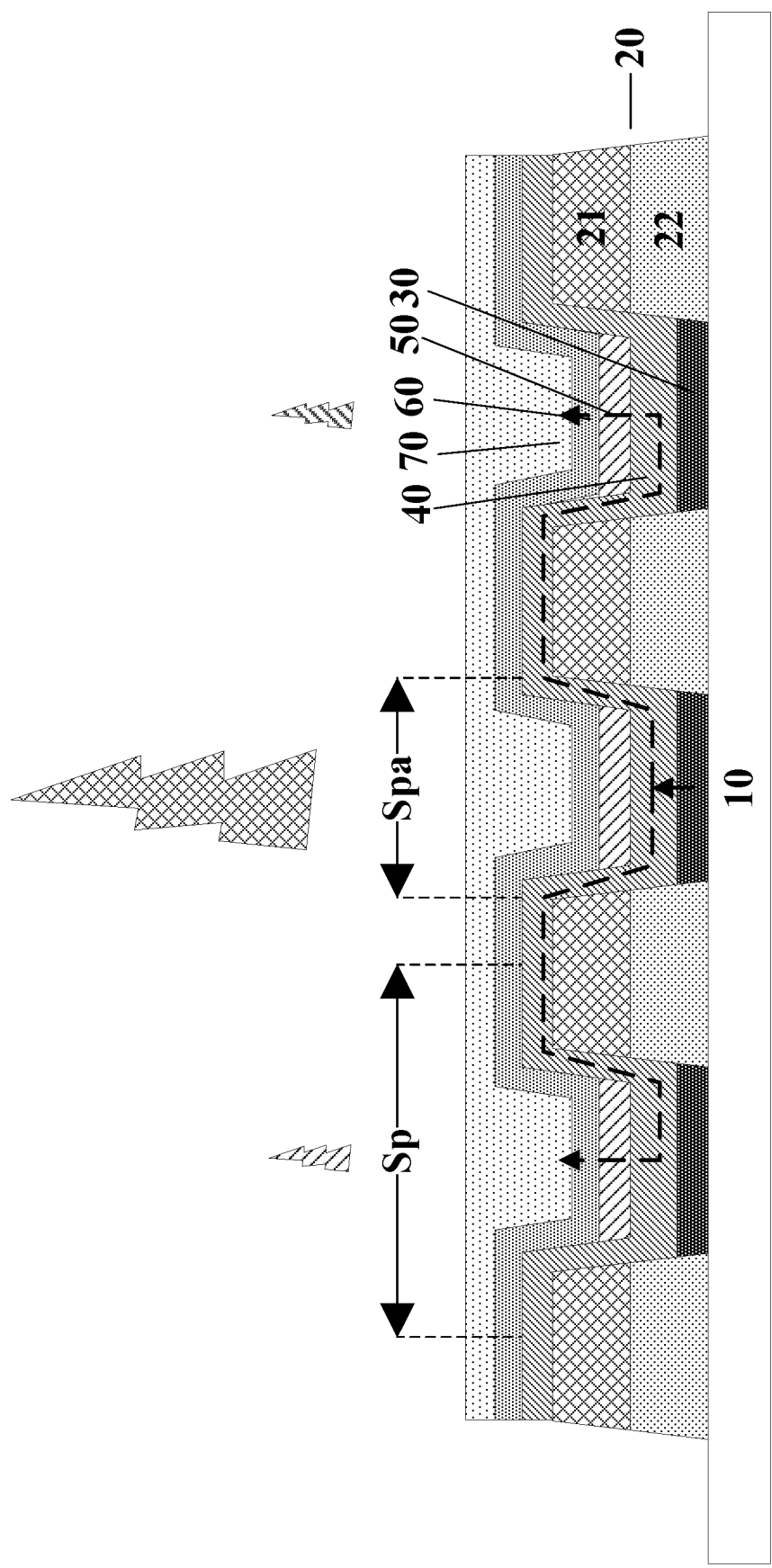
FIG. 7 illustrates occurrence of a cross-subpixel interference in a display substrate in some embodiments according to the present disclosure.

FIG. 7 illustrates occurrence of a cross-subpixel interference in a display substrate in some embodiments according to the present disclosure. Referring to FIG. 7, the organic functional layer 40 remains as a continuous integral layer spanning across the plurality of subpixels Sp. As a result, when a subpixel (e.g., the subpixel in the middle of FIG. 7) is provided with a data signal, the current provided to the first electrode 30 can leak through the continuous integral organic functional layer 40 into adjacent subpixels (e.g., the left and right subpixels of FIG. 7). As a result, when the middle subpixel is configured to emit light, the signal will leak into adjacent subpixels and drive the adjacent subpixels to emit light, resulting in the cross-subpixel interference.

Referring to FIGS. 1, 2, and 4, the organic functional layer 40 is segregated into a plurality of blocks respectively in the plurality of subpixel apertures Spa, even if the organic functional layer 40 is formed by initially depositing an organic functional material in an open mask deposition process. Referring to FIG. 4, the organic functional layer 40 is spaced apart and disconnected from the residual organic layer 41. Thus, the current provided to the middle subpixel will not leak into adjacent subpixels, obviating the cross-subpixel interference.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A display substrate having a plurality of subpixels, comprising:
a base substrate; and
a pixel definition layer defining a plurality of subpixel apertures;
wherein the pixel definition layer comprises a smart material sub-layer comprising a photostrictive material or a photo expansive material; and
the smart material sub-layer has a first side closer to the base substrate, a second side opposite to the first side and away from the base substrate, and a lateral side connecting the first side and the second side;
wherein the display substrate in a respective one of the plurality of subpixels comprises:
an organic light emitting layer in a respective one of the plurality of subpixel apertures;
a first electrode on a side of the organic light emitting layer closer to the base substrate; and
an organic functional layer on a side of the first electrode away from the base substrate and between the first electrode and the organic light emitting layer;
wherein the display substrate further comprises a second residual organic layer on a lateral side of the smart material sub-layer; and
the second residual organic layer is spaced apart and disconnected from the organic functional layer in the respective one of the plurality of subpixel apertures.

2. The display substrate of claim 1, wherein the organic functional layer in the respective one of the plurality of subpixel apertures is spaced apart and disconnected from counterparts in adjacent subpixel apertures of the plurality of subpixel apertures.

3. The display substrate of claim 2, wherein the first electrode is an anode; and
the organic functional layer comprises one or a combination of a hole injection layer and a hole transport layer.

4. The display substrate of claim 2, wherein the first electrode is a cathode; and
the organic functional layer comprises one or a combination of an electron injection layer and an electron transport layer.

5. The display substrate of claim 2, further comprising a residual organic layer on a side of the smart material sub-layer away from the base substrate;
wherein the residual organic layer is spaced apart and disconnected from the organic functional layer in the respective one of the plurality of subpixel apertures;
an orthographic projection of the residual organic layer on the base substrate at least partially overlaps with an orthographic projection of the smart material sub-layer on the base substrate; and
the residual organic layer and the organic functional layer are in a same layer and comprise a same material.

6. The display substrate of claim 5, wherein at least a portion of the lateral side is absent of the residual organic layer and the organic functional layer, thereby disconnecting the residual organic layer from the organic functional layer, and disconnecting the organic functional layer in the respective one of the plurality of subpixel apertures from the counterparts in adjacent subpixel apertures of the plurality of subpixel apertures.

7. The display substrate of claim 1, wherein the pixel definition layer further comprises a second sub-layer on a side of the smart material sub-layer closer to the base substrate, the second sub-layer and the smart material sub-layer being made of different materials.

8. The display substrate of claim 1, wherein the photostrictive material comprises an organic polymer material selected from a group consisting of photostrictive polymer network comprising metal-organic cages as crosslinks, photostrictive liquid crystal polymer network, photostrictive polyamides having azobenzene chromophores in the main chain, poly-(4,4'-diaminoazobenzenepyromellitimide), and poly(ethylacrylate) network with azo-aromatic crosslinks.

9. A display apparatus, comprising the display substrate of claim 1, and one or more integrated circuits connected to the display substrate.

10. A method of fabricating a display substrate having a plurality of subpixels, comprising:
forming a pixel definition layer on a base substrate to define a plurality of subpixel apertures;

forming an organic light emitting layer in a respective one of the plurality of subpixel apertures in a respective one of the plurality of subpixels;

prior to forming the organic light emitting layer, forming a first electrode on the base substrate in the respective one of the plurality of subpixels; and prior to forming the organic light emitting layer and subsequent to forming the first electrode, forming an organic functional layer on a side of the first electrode away from the base substrate;

wherein forming the pixel definition layer comprises forming a smart material sub-layer using a material comprising a photostrictive material or a photoexpansive material;

the smart material sub-layer has a first side closer to the base substrate, a second side opposite to the first side and away from the base substrate, and a lateral side connecting the first side and the second side;

the method further comprises forming a second residual organic layer on a lateral side of the smart material sub-layer; and the second residual organic layer is spaced apart and disconnected from the organic functional layer in the respective one of the plurality of subpixel apertures.

11. The method of claim 10, wherein the organic functional layer in the respective one of the plurality of subpixel apertures is formed to be spaced apart and disconnected from counterparts in adjacent subpixel apertures of the plurality of subpixel apertures.

12. The method of claim 11, wherein forming the organic functional layer comprises:

depositing an organic functional material layer on a side of the first electrode away from the base substrate, the organic functional material layer deposited to at least partially cover the smart material sub-layer; and applying a non-mechanical external stimulus on the smart material sub-layer to induce the smart material sub-layer to undergoes a deformation to segregate the organic functional material layer into a plurality of blocks, a respective one of the plurality of blocks in the respective one of the plurality of subpixel apertures, the respective one of the plurality of blocks being spaced apart and disconnected from counterparts in adjacent subpixel apertures of the plurality of subpixel apertures, thereby forming the organic functional layer.

13. The method of claim 12, wherein the deformation segregates the organic functional material layer into the plurality of blocks respectively in the plurality of subpixel apertures, and a residual organic layer on a side of the smart material sub-layer away from the base substrate;

the residual organic layer is spaced apart and disconnected from the organic functional layer in the respective one of the plurality of subpixel apertures; and an orthographic projection of the residual organic layer on the base substrate at least partially overlaps with an orthographic projection of the smart material sub-layer on the base substrate.

14. The method of claim 13, wherein the deformation results in at least a portion of the lateral side being absent of the residual organic layer and the organic functional layer, thereby disconnecting the residual organic layer from the organic functional layer, and disconnecting the organic functional layer in the respective one of the plurality of subpixel apertures from the counterparts in adjacent subpixel apertures of the plurality of subpixel apertures.

15. The method of claim 10, wherein forming the pixel definition layer further comprising, prior to forming the smart material sub-layer, forming a second sub-layer using a material different from a material of the smart material sub-layer.

16. The method of claim 11, wherein the first electrode is formed as an anode; and forming the organic functional layer comprises, prior to forming the organic light emitting layer, forming one or a combination of a hole injection layer and a hole transport layer.

17. The method of claim 12, wherein applying a non-mechanical external stimulus on the smart material sub-layer comprises irradiating light on the smart material sub-layer.

* * * * *